(12) United States Patent
De Samber et al.

(10) Patent No.: US 6,998,533 B2
(45) Date of Patent: Feb. 14, 2006

(54) ELECTRONIC DEVICE AND METHOD OF MANUFACTURING SAME

(75) Inventors: Marc Andre De Samber, Eindhoven (NL); Johannus Wilhelmus Weekamp, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/510,304

(22) PCT Filed: Apr. 11, 2003

(86) PCT No.: PCT/IB03/01296

§ 371 (c)(1),
(2), (4) Date: Oct. 6, 2004

(87) PCT Pub. No.: WO03/085736

PCT Pub. Date: Oct. 16, 2003

(65) Prior Publication Data

US 2005/0117271 A1    Jun. 2, 2005

(30) Foreign Application Priority Data

Apr. 11, 2002 (EP) ................................. 02076425
Aug. 5, 2002 (EP) ................................. 02078208
Oct. 30, 2002 (EP) ................................. 02079541

(51) Int. Cl.
*H01L 23/28* (2006.01)
(52) U.S. Cl. ..................................... 174/52.2; 174/52.4
(58) Field of Classification Search .............. 174/52.2, 174/52.4; 257/693, 787, 692
See application file for complete search history.

(56) References Cited

U.S. PATENT DOCUMENTS

| | | | |
|---|---|---|---|
| 5,081,563 A | | 1/1992 | Feng |
| 5,353,195 A | * | 10/1994 | Fillion et al. ............... 361/760 |
| 5,699,232 A | * | 12/1997 | Neidig et al. ............... 361/752 |
| 5,764,484 A | * | 6/1998 | Hoffman et al. ............ 361/761 |
| 6,087,721 A | | 7/2000 | Akhnoukh |

FOREIGN PATENT DOCUMENTS

| | | |
|---|---|---|
| EP | 0718882 A1 | 6/1996 |
| EP | 0920058 A2 | 6/1999 |

* cited by examiner

*Primary Examiner*—Hung V. Ngo
(74) *Attorney, Agent, or Firm*—Aaron Waxler

(57) ABSTRACT

The electronic device (100) comprises a body (20) with a cavity (30) wherein a semiconductor element (10) and a thermally conductive layer (33) are present. The cavity (30) is filled with an encapsulation (35) of an electrically insulating material wherein contact faces (47, 48) are mechanically anchored.

12 Claims, 4 Drawing Sheets

ELECTRONIC DEVICE AND METHOD OF MANUFACTURING SAME

Figure 1:
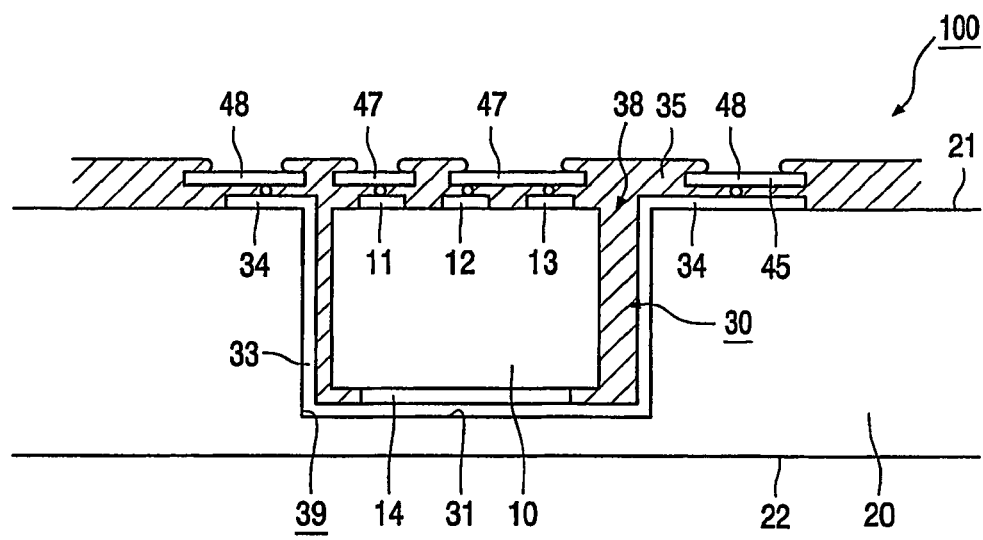

The invention relates to an electronic device comprising a body having a cavity with an inner side and an aperture, a semiconductor element provided with contacts, which semiconductor element is present in the cavity and at least part of its contact are situated in the aperture of the cavity.

The invention also relates to methods of manufacturing an electronic device comprising a body having a cavity with an inner side and an aperture, and a semiconductor element provided with contacts, which semiconductor element is present in the cavity and at least part of its contacts are situated at the aperture of the cavity.

Such a method and such a semiconductor device are disclosed in U.S. Pat. No. 6,087,721. The known semiconductor device comprises a thermally conductive layer on which a body of insulating material is provided. A bipolar transistor is present that serves as the semiconductor element. This transistor has all its contacts in the aperture. On the side facing away from the aperture, the transistor is placed on a conductive surface. This surface is in contact with the thermally conductive layer via a preferably thermally conductive intermediate layer.

A drawback of the known semiconductor device resides in that the contacts must be connected to bonding wires. With a view to miniaturization it is desirable to substitute bonding wires with metal or solder bumps. If further elements are present, it must be possible, however, to connect the semiconductor element to said further elements.

Therefore, it is a first object of the invention to provide a semiconductor device of the type described in the opening paragraph, which can be placed on a carrier by means of solder or metal bumps.

Said object is achieved in that the contacts are in electric contact, via conductive connecting pieces, with contact surfaces, which contact surfaces are anchored in electrically insulating material. In the device according to the invention, contact surfaces are provided as islands and bridges in the electrically insulating material, which also serves as an adhesive material for these contact surfaces. The contact surfaces are present in a plane that is parallel to the cavity, yet extends substantially outside said cavity. In this manner, the device can be placed on a carrier by means of solder or metal bumps or in a similar fashion.

It is a first advantage of the invention that the contact surfaces can be very close to the contacts, which is not possible if use is made of leads or bonding wires. In this manner, losses at higher frequencies caused by self-inductance of the leads or the bonding wires are minimized.

It is a second advantage of the invention that it can also be embodied so as to have small dimensions. The size of the contact surfaces can be chosen to be much large than that of the contacts to make sure that sufficient current is supplied and to be in keeping with the placement accuracy on the carrier.

In a first embodiment, the body comprises an electrically insulating material which encapsulates the semiconductor element with the exclusion of the aperture. In fact this body is nothing more than the semiconductor element, or an array thereof, that is provided with an encapsulation. Such encapsulation may be realized by providing the one or more semiconductor elements with their contacts on a temporary carrier, molding so as to provide the encapsulation and removing the temporary carrier. The important advantage hereof resides particularly in the embodiment with more than one semiconductor and other element: the contact surfaces will then be provided with electrically conductive interconnects to interconnect the semiconductor devices according to a desired pattern. Suitable combinations of semiconductor elements include semiconductor elements on the basis of different substrates, such as silicon, GaAs, GaN and InP; other elements such as magnetoresistive sensors, microelectromechanical elements (MEMS), bulk acoustic wave filters and the like.

In a second embodiment, the electrically insulating material forms an envelope, which also fills the cavity. In this manner the insulating material also adequately encapsulates the semiconductor element. An additional protective layer can thus be dispensed with. As a result, there is greater freedom as to the choice of the body surrounding the cavity. The body may be of a polymer material, but glass or ceramic are also possible. It may alternatively be a multilayer substrate comprising components and conductors. The use of glass has the additional advantage that the cavities can be adequately manufactured at low cost by means of powder blasting.

In a favorable embodiment, a thermally conductive layer is present which is in thermal communication with the semiconductor element and which is at least partly situated on the inner side of the cavity. In this manner heat dissipation is guaranteed. This is particularly important in the case of power elements. If a conventional bipolar transistor is used, the thermally conductive layer can be used as a connection for the collector-electrode. The thermally conductive layer is then guided to the first side where it contacts a contact surface. Favorably, the contact surfaces, which are present on a substrate, are integrally assembled with the other part of the device.

In a further embodiment, the thermally conductive layer may cover only part of the inner side of the cavity. This embodiment is particularly suited for semiconductor elements having all contacts at the aperture, such as integrated circuits, field effect transistors. This is favorable, in particular, in combination with a body with internal conductors. In this case the thermally conductive layer in fact continues through the substrate, thereby also enabling conductive connections with the side of the device facing away from the aperture.

In a different embodiment, the device comprises further components which are connected, as desired, with contacts of the semiconductor element by electroconductive tracks (i.e. interconnects). Such components can be accommodated in separate cavities of a desired size and depth, but they can alternatively be assembled on the body or provided using thin and thick film processes. It is additionally possible that some components are present in the cavity itself. The electroconductive tracks can be arranged in the body. The tracks can also be connected to the contact surfaces. The device then has connection points in another, suitable position. Examples of such components are passive components, such as resistors, coils, capacitors and transformers; high-frequency components such as resonators, strip lines, couplers, switches; and sensors.

The semiconductor component preferably is a transistor. Transistors can very suitably be used as power amplifiers. In a device having such a transistor it is required that the contacts are present on a side, that heat is properly dissipated, that the height of the device is small, and that the device can be manufactured at low cost. The device in accordance with the invention meets all said requirements.

For the insulation material use can suitably be made of many materials provided they can be provided in the liquid state. Examples of suitable materials are polymers, such as epoxy-like materials, polyacrylates, polyimides, but also ceramic materials such as silica, alumina and similar materials that are provided by means of sol-gel processing, and organic materials such as benzocyclobutene. It is particularly advantageous to apply a thermally curable material since the cover is not necessarily transparent. To preclude parasitic capacitances, use is preferably made of a material having a low dielectric constant, such as an alkyl-substituted silica, HSQ, benzocyclobutene, SiLk.

It is a second object of the invention to provide a method of the type mentioned in the opening paragraph, by means of which a semiconductor device can be obtained that can be placed on a carrier by using bumps, and which method can be carried out for a large number of devices at the same time.

The second object of the invention is achieved in that the method comprises the steps of:

providing the body with the semiconductor element and a cover, which cover comprises a patterned layer of electroconductive material and a sacrificial layer, assembling the body and the cover in such a manner that the contacts of the semiconductor element are connected to the patterned layer of the cover providing an envelope between the cover and the body, the patterned layer being mechanically anchored in the envelope, and removing the sacrificial layer from the cover.

The use of a sacrificial layer enables the manufacture to be simplified to predominantly the assembly of a cover and a body, after which the envelope is provided. This process is very robust. If desirable, structural aligning means may be provided for aligning the cover and the body. To interconnect the conductive layers in the cover and the body use is made of a thermally conductive, known connection means such as an anisotropically conductive glue, a solder or metal bump, or the like. This has the additional advantage that the process can be carried out independently of the specific shape of the cavity, the material of the body or the constitution of the semiconductor element. What is paramount is that a good connection is established between the contacts of the semiconductor element and the contact surfaces. At the same time there is enough freedom of design and construction: firstly, the contact surfaces can be locally provided, i.e. at the location of the contacts, with thickened portions to compensate for differences in height. Secondly, bumps can be applied that allow some play. Thirdly, the process can be applied on a large scale using standard elements. Thus, the design of the cavity can be adapted thereto.

The sacrificial layer chosen is a layer that forms a substrate for the conductive layer and that can be removed after assembly. For example silicon and aluminum are suitable materials which can be removed very well by means of etching.

Oxides, such as alumina and silica are also suitable as well as polyimides, acrylates and other condensation polymers. They are removed, for example, by means of etching, polishing or delaminating. A combination of these techniques is also possible, which is particularly favorable if the sacrificial layer comprises a stack of layers. An example of such a stack is an Si—SiO$_2$—Si stack. The patterned layer has a thickness of for instance 1 to 40 $\mu$m., preferably 5 to 15 $\mu$m. The sacrificial layer has a thickness of for instance 25 to 75 $\mu$m.

In a first embodiment the body with the semiconductor element is provided by:

providing the semiconductor element on a temporary carrier, the contacts being at the side of the temporary carrier;

molding the semiconductor element, therewith forming the body of electrically insulating material; and removal of the temporary carrier, therewith providing the aperture. This embodiment is particularly suitable for the manufacture of multichip modules.

In a second embodiment the body with the semiconductor element is provided with a thermally conductive layer at the inner side of the cavity, which is in thermal communication with the semiconductor element, and wherein the body with the semiconductor element is provided by placing the semiconductor element on the thermally conductive layer of the body. This allows the manufacture of devices with good heat dissipation.

An alternative realization of this embodiment resides therein that the semiconductor elements are not placed in the cavities of the body, but are place on the electrically conductive, patterned layer of the cover. This alternative realization is a method according to claim 10.

In a favorable embodiment, a patterned sub-layer is present in the cover, between the patterned layer and the sacrificial layer, which patterned layer and which sub-layer comprise a first and a second pattern, which patterns are mutually separated by a recess having a larger diameter in the plane of the sub-layer than in the plane of the patterned layer. In this manner, the patterned layer is directly mechanically anchored in the envelope: when the envelope is provided, the recesses are filled; by virtue of the larger diameter of the recess in the sub-layer, the envelope is present below, above and next to the patterned layer. In this connection, it is favorable if the sub-layer is patterned essentially according to the same mask as the patterned layer. What is different, however, is that, in a plane parallel to the first side, the patterns in the sub-layer have a smaller diameter than corresponding patterns in the patterned layer. It is favorable, in particular, if the patterned layer serves as the etch mask for the sub-layer, and if a wet-chemical etching operation is carried out, resulting in the formation of an underetch.

The sub-layer may be part of the sacrificial layer. Alternatively, the sub-layer may comprise different materials. If the sub-layer is part of the sacrificial layer, the small diameter of the sub-layer is obtained by an etching treatment in an etchant which is selective with respect to the material of the patterned layer.

For the envelope use is preferably made of an insulating material. It is favorable if the provision of the envelope does not only lead to the contact surfaces being anchored in the envelope but also to the semiconductor element being encapsulated by the envelope. The mechanical anchoring is the result of patterns in the patterned conductive layer of the cover having a larger diameter than the corresponding patterns in the underlying sub-layer. With respect to the sub-layer, the patterns in the patterned layer have projecting edges which are anchored in the envelope.

In a favorable embodiment, the body comprises a plurality of cavities. After semiconductor elements have been placed, the body is assembled with a suitable cover. Only after the sacrificial layer has been removed, the assembly of body and cover is separated into individual electronic devices.

In a further embodiment, the body comprises glass. The cavity is formed in this glass body by means of a blasting technique, after which a thermally conductive layer is applied on the inner side of the cavity, which layer extends to beyond the cavity. A favorable example of a blasting technique is powder blasting, which is known per se to persons skilled in the art. The use of glass has the advantage that it provides for very good insulation. In addition, glass is easy to process both in respect of the formation of cavities and the separation of large glass plates into individual devices. Besides, by choosing the glass, the thermal conductivity thereof can be adjusted.

In a different embodiment, the body is provided by deforming a foil of a thermally conductive layer and a sacrificial layer so as to form the cavity, the sacrificial layer being removed after the envelope has been provided between the body and the cover. In fact, the material used for the body and for the cover is the same. In an additional step, the body is deformed. This deforming operation may be a folding operation. To form a cavity, use is preferably made however of a mold for depressing the foil. Good results have been achieved in this manner. The foil deformation process is described in greater detail in the non-prepublished application EP 02078208.2 (PHNL020719), which is considered to be included herein by reference.

In a particularly advantageous modification of this embodiment, the body is provided with a protective coating, for example by molding using a polymer material, after the sacrificial layer has been removed. The resultant device essentially comprises the semiconductor element, the contact surfaces, the thermally conductive layer and the envelope. This device is very light and can be embodied so as to have small dimensions, while at the same time the heat-dissipating power is sufficient.

These and other aspects of the device and the method in accordance with the invention are apparent from and will be elucidated with reference to the embodiment(s) described hereinafter.

In the drawings:

FIG. 1 is a diagrammatic cross-sectional view of a first embodiment of the device;

FIGS. 2A–D are diagrammatic cross-sectional views of the body, the cover and the device in different stages of the method;

FIGS. 3A–H are diagrammatic cross-sectional views of the body and the cover in different stages of a second embodiment of the method, resulting in a second embodiment of the device.

The figures are not drawn to scale and some dimensions are exaggerated strongly for clarity. Corresponding regions or parts are indicated by means of the same reference numerals whenever possible.

FIG. 1 is a diagrammatic cross-sectional view of a first embodiment of a device 100 in accordance with the invention. Said device 100 comprises a body 20, for example of glass, having a first side 21 and a second side 22 facing away from said first side. The body 20 has a cavity 30 with an aperture 38 on the first side 21. This aperture 38 is closed by a patterned layer 45 and an envelope 35. The cavity 30 has an inner side 39 wherein the bottom 31 of the cavity 30 is situated. The inner side 39 of the cavity 30 is provided entirely, in this example, with a thermally conductive layer 33 having a thickness between 5 and 50 $\mu$m, preferably in the range from 10–25 $\mu$m. The thermally conductive layer 30 extends as far as the end portions 34 on the first side 21 of the body 20. The cavity 30 accommodates a semiconductor element 10, in this case a bipolar transistor, with emitter and base contacts 11, 12, 13 on the first side 21 of the body 20 and a collector contact at the bottom 31 of the cavity 30. The transistor 10 is in thermal contact with the thermally conductive layer 33 via the bottom 31 of the cavity 30. To attach the semiconductor element 10 to the bottom 31 of the cavity use is made of a conductive adhesive layer 14. The cavity is additionally filled with the envelope 35 in which also the patterned layer 45 is mechanically anchored. This patterned layer 45 having a thickness ranging preferably between 10 and 50 $\mu$m comprises contact surfaces 47, 48. The contact surfaces 48 are in contact with the end portions 34 of the thermally conductive layer 33. The contact surfaces 47 are in contact with the contacts 11, 12, 13 of the transistor 10. In addition to contact surfaces 47, 48, the patterned layer 45 may comprise interconnects by means of which the semiconductor element 10 is connected to other elements in the device. For example, it is possible that the thermally conductive layer does not cover the entire inner surface of the cavity 30, but that contacts are present instead. A suitably chosen connection of contact surfaces 47 and 48 then provides for an interconnect to the first side 21 of the body 20. The patterned thermally conductive layer 33 can also suitably be used then as an interconnect layer on which further elements are placed. If the semiconductor element 10 is a field effect transistor, or another element with all contacts on one side, the thermally conductive layer 33 does not have to extend as far as the first side 21 of the body 20 provided that another way of heat dissipation has been realized, for example via heat conductors in the body 20 or via a thermally conductive connection, such as a metal connection from the bottom 31 of the cavity 30 to the second side 22 of the device 100.

FIG. 2 shows several stages in the manufacture of the device 100 shown in FIG. 1. The body 20 shown in FIG. 2A and the cover 40 shown in FIG. 2B are used as the starting elements.

Figure 2A:
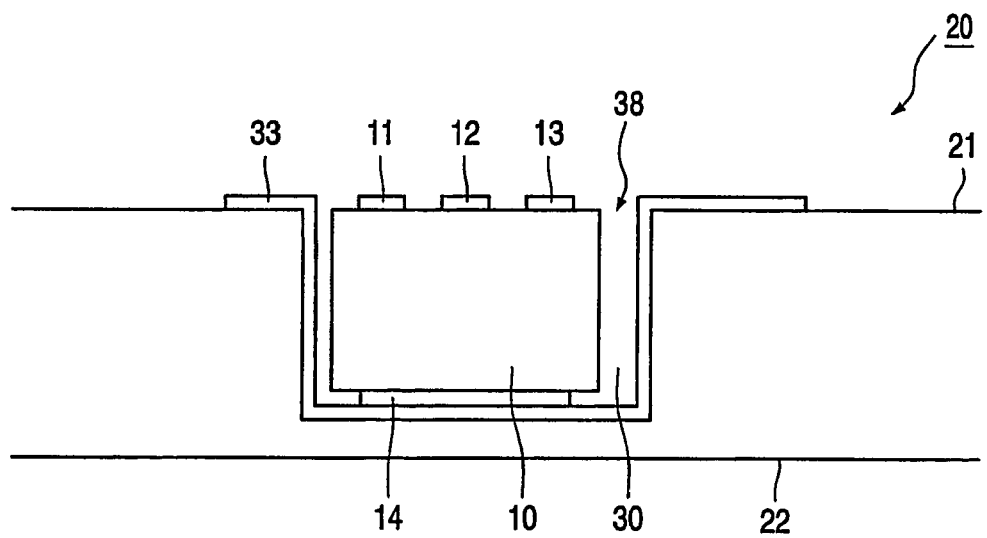

FIG. 2A shows the body 20 prior to assembly. The body 20 comprises glass and is provided with cavities 30 at the level of the board by means of powder blasting. The aperture 38 of the cavity 30 is present on the first side 21 of the body 20. The process of forming such cavities 30 in bodies 20 is known per se and is used, for example, for display screens on the basis of polymeric light-emitting diodes. The depth of the cavity 30 is adapted to the height of the semiconductor element 10 to be placed. After the formation of the cavities 30, the thermally conductive layer 33 of copper is deposited by means of sputtering via a mask. The thermally conductive layer can also be patterned in a photolithographic process, in particular, if this is the last step in the manufacturing process, i.e. when the cavity is filled. The photoresist that is needed for the photographic patterning and which is applied by spincoating, will then be spread over the first side. After the thermally conductive layer 33 has been applied, the semiconductor element 10 is placed, said semiconductor element being provided with an adhesive layer 14. Next, the semiconductor element 10 is provided with solder or metal bumps at the contacts 11, 12, 13 and at the ends of the thermally conductive layer 33. For the solder material use is made of, for example, PbSn.

Figure 2B:
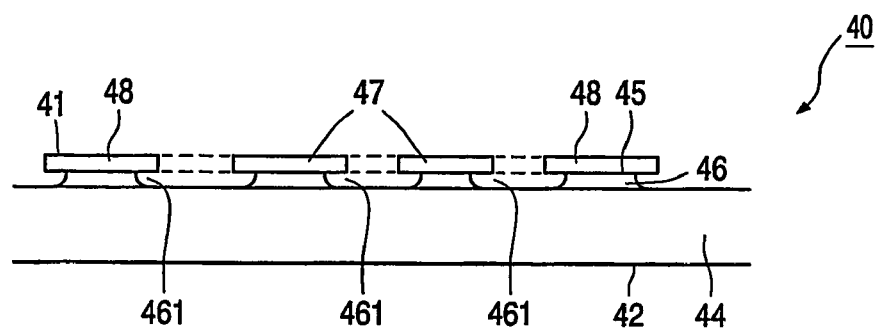

FIG. 2B shows the cover 40 prior to assembly. In this example, which is not essential, the cover 40 has a first side 41 and a second side 42, a patterned layer 45 being applied to the first side 41 and a sacrificial layer 44 being applied to the second side 42. A sub-layer 46 is in contact with the patterned layer 45, which sub-layer is part of the sacrificial layer 44, in this embodiment. Here, the sacrificial layer 44 is an approximately 60 $\mu$m thick aluminum layer. The patterned layer 45 comprises copper and has a thickness of approximately 10 $\mu$m. The patterned layer 45 and the sub-layer 46 comprise patterns 47 between which there is a recess 461. This recess 461 has a larger diameter in the plane of the sub-layer 46 than in the plane of the patterned layer 45.

The cover 40 is manufactured as follows: a halter-shaped mask of silicon dioxide is formed by means of photolithography on the patterned layer 45, after which the copper of the patterned layer 45 is removed outside said mask by means of etching using an aqueous solution of ferric chloride. In this process, a recess 461 is formed in the cover 40. By means of said recess 461 contact surfaces 47, 48 are defined. Another, selective etchant is subsequently used to remove part of the sacrificial layer 44. In this process, underetching of the sacrificial layer 44 occurs relative to the patterned layer 45, thereby forming the sub-layer 46. For example caustic soda can be used as the selective etchant for aluminum.

Figure 2C:
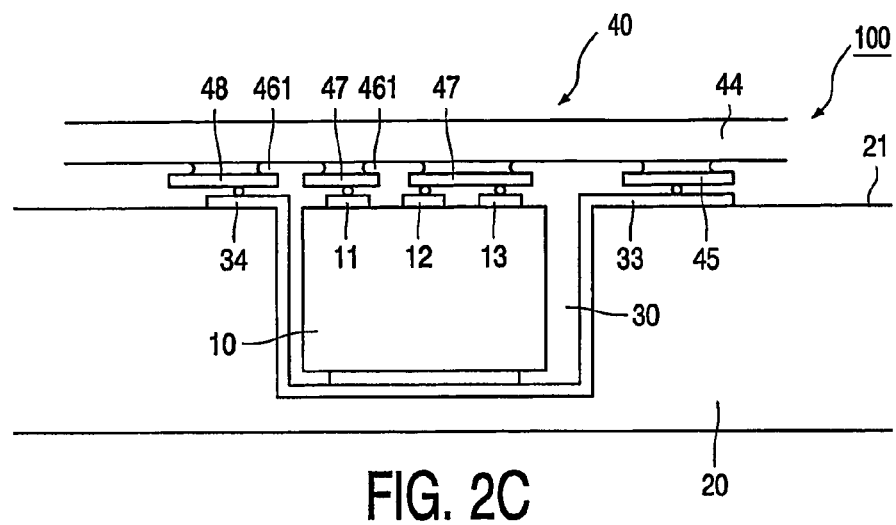

FIG. 2C shows the device 100 after assembly of the cover 40 and the body 20. The body 20 and the cover 40 are aligned by means of mechanical aligning means provided in the patterned layer 45 of the cover and in the thermally conductive layer 33 on the first side 21 of the body 20. Alternatively, for example, light can be used for said alignment. To obtain a sufficiently sealing connection between the patterned layer 45 and the thermally conductive layer 33, a thermal treatment is carried out at approximately 200° C.

It is noted that it is alternatively possible to place the semiconductor element 10 on the cover 40, after which assembly takes place. Particularly in said case, various interconnection techniques, such as solder, conductive adhesive, metal bumps, diffusion connection, can be used to interconnect the contacts 11, 12, 13 and the contact surfaces 47 on the one hand, and the ends of the thermally conductive layer 33 and the contact surfaces 48 on the other hand. Instead of solder, metal bumps can be used as the connection means between the contacts of the body 20 and the contact surfaces 47, 48 of the cover. In said case, it is generally required however to apply an adhesive layer to the copper, for example a layer of Au, Ag, Pd and/or Ni and, preferably, to the thermally conductive layer 33 as well as to the patterned layer 45. For the bumps use can be made of, inter alia, Au and alloys of Au, such as Au—Sn. The use of Au—Sn is very favorable in combination with an acrylate layer, as described in the non-prepublished application EP 02077228.1 (NL020471).

Figure 2D:
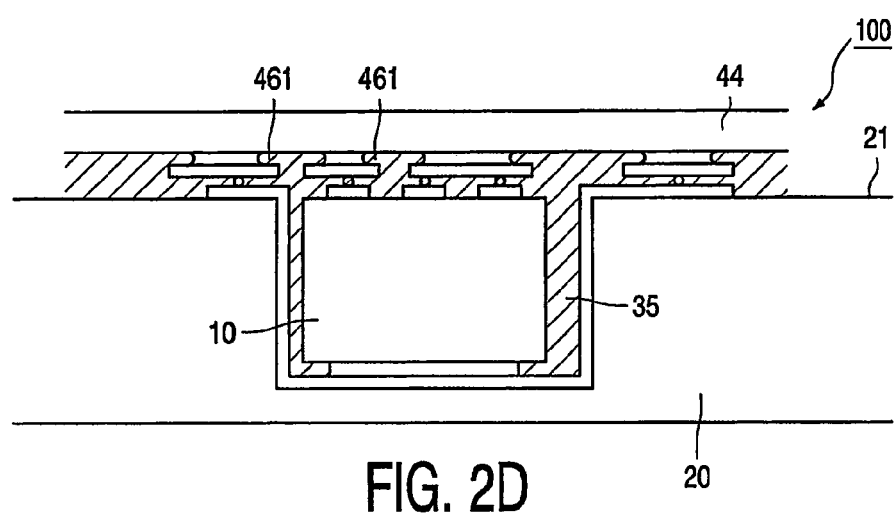

FIG. 2D shows the device 100 after the envelope 35 of insulating material has been provided in the cavity 30. In this example, an epoxy is used as the insulating material. Capillary forces, if necessary followed by a vacuum treatment, make sure that the epoxy also fills the recesses 461. After said filling process, an additional heating step is carried out to cure the insulating material.

Figure 2E:
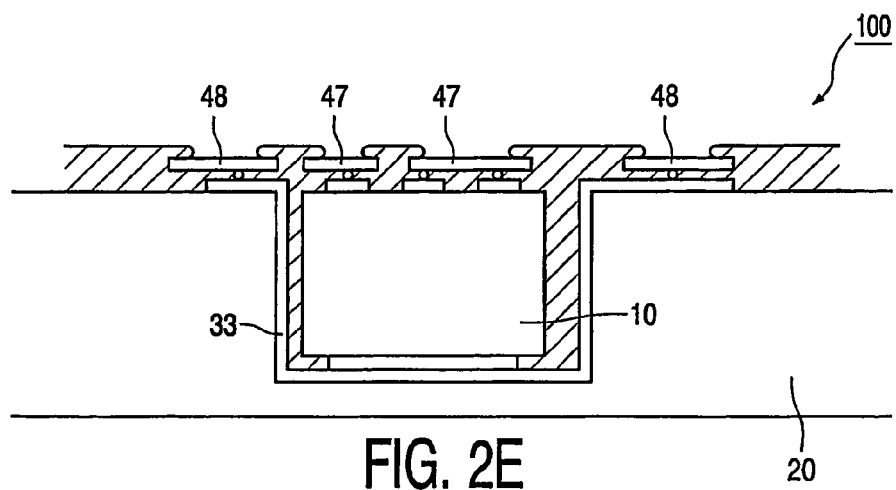

FIG. 2E finally shows the device 100 after the sacrificial layer 44 has been removed. Said layer is removed, in this example, by etching using caustic soda. In fact, the device 100 is ready now. Next, bumps can be provided on the contact surfaces 47, 48. If the device 100 has been manufactured at the level of the board, the body 20 is first separated into individual devices. To simplify this separation process, the patterned layer 45 and the thermally conductive layer 33 are patterned such that they are absent at the location of the sawing paths. Alternatively, also additional layers can be provided on the contact surfaces 47, 48.

FIGS. 3A–H show a second embodiment of the method of manufacturing the device 100. They show in diagrammatic cross-sectional views various stages in the manufacturing process. In fact, the method is carried out in the same manner as the method described with reference to FIGS. 2A–E. The difference between the methods resides in that for the body 20 with the thermally conductive layer 33 use is made of a foil that is essentially identical to the foil used as a cover. In this application, the foil must be deformed first. At a later stage, the sacrificial layer of the foil can be substituted with an insulating layer. As a result, the device can remain limited to a thermally conductive layer 33 and a semiconductor element 10 which are encapsulated in the enveloping layers 35, 25, while all contact surfaces 47, 48 are situated on the first side 21 of the device 100. This has the advantage that the device 100 is very light and can be manufactured on a small scale.

Figure 3A:
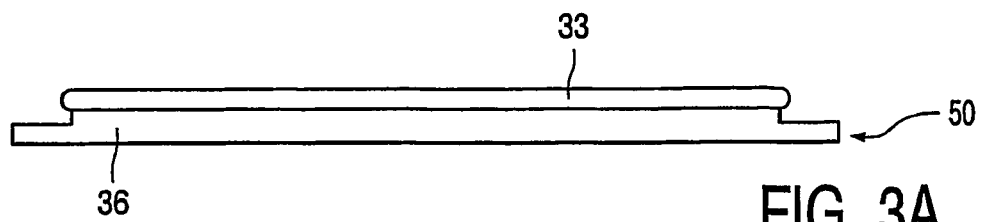
Figure 3B:
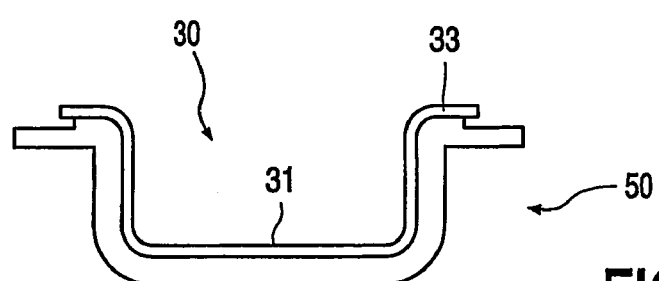
Figure 3C:
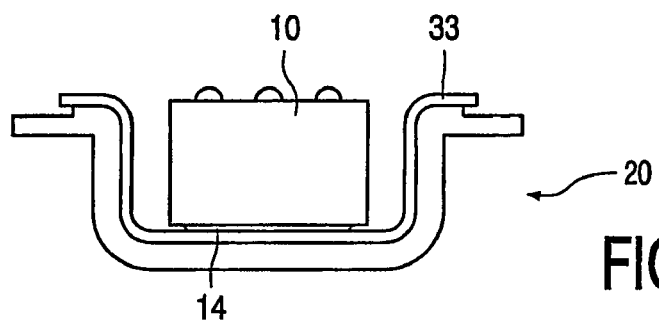

FIGS. 3A–C show three steps in the manufacture of the body 20 prior to assembly. A foil 50 with the thermally conductive layer 33 and a sacrificial layer 36 are used as the starting elements. After the thermally conductive layer 33 has been patterned, if necessary, in accordance with a desired pattern, the foil 50 is formed. For this purpose, a mold is brought into contact with the foil 50, the foil being present on a hard substrate (which may be part of the mold). The mold is provided with a desired pattern, such that the cavity 30 is realized. The mold is, for example, a Si substrate with Ni bumps in the desired pattern thereon. The mold may be situated on either side of the foil 50; in other words, the pattern in the mold may be the positive of the cavity 30 or the negative of said cavity.

Figure 3D:
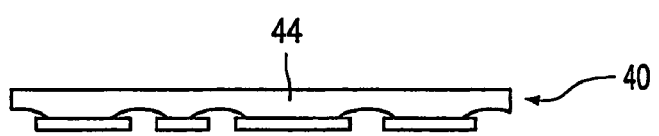
Figure 3E:
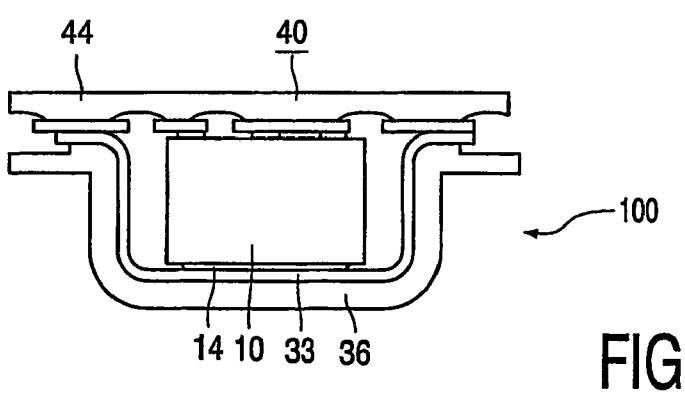
Figure 3F:
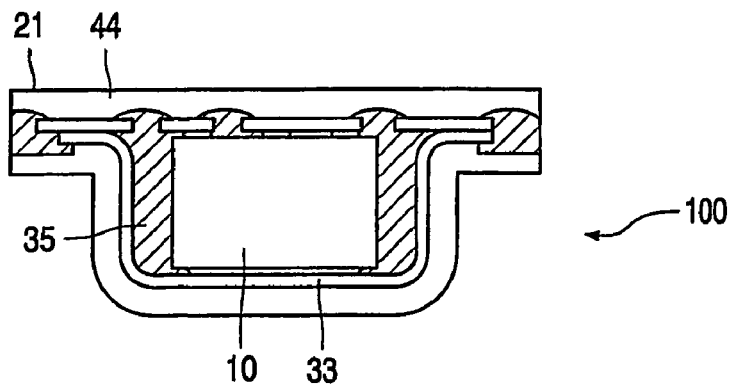

FIG. 3D shows the cover 40. FIG. 3E shows the assembled device 100. FIG. 3F shows the device 100 after the envelope 35 has been provided. These steps are identical to the steps discussed with reference to the FIGS. 2B–2D.

Figure 3G:
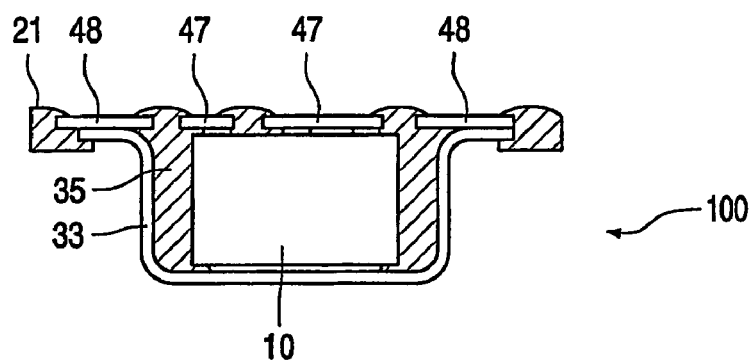

FIG. 3G shows the device 100 after the sacrificial layers 44 and 36 have been removed. When the device 100 is immersed in an etch bath, this can take place in a single step. Of course, the sacrificial layers may be composed of a different material, in which case two etch baths are used. If the sacrificial layer 36 is of an insulating material or if the only patterns provided in the thermally conductive layer 33 are the connection from the bottom 31 of the cavity 30 to the first side 21 of the body, it is not necessary to remove the sacrificial layer 36.

Figure 3H:
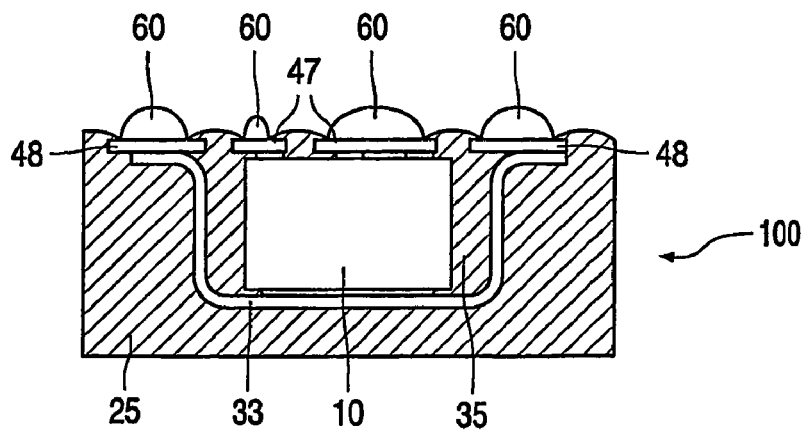

FIG. 3H shows the device 100 after a further envelope 25 has been provided, and after solder 60 has been provided on the contact surfaces 47, 48.

What is claimed is:

1. An electronic device having
a body having a cavity with an inner side and an aperture
a semiconductor element provided with contacts, which semiconductor element is present in the cavity and at least part of its contacts are situated at the aperture of the cavity;
characterized in that the contacts are in electric contact, via conductive connecting pieces, with contact surfaces, which contact surfaces are anchored in electrically insulating material, wherein the electrically insulating material forms an envelope, which also fills the cavity and wherein the device further comprises a thermally conductive layer which is in thermal communication with the semiconductor element and is at least partly situated on the inner side of the cavity.

2. An electronic device as claimed in claim 1, wherein the body comprises an electrically insulating material which encapsulates the semiconductor element with the exclusion of the aperture.

3. An electronic device as claimed in claim 1, characterized in that the body is a multilayer substrate of insulating material with conductive intermediate layers, the thermally conductive layer being part of an intermediate layer of the multilayer substrate.

4. An electronic device as claimed in claim 1, characterized in that further components are present, which are connected, as desired with the contacts of the semiconductor element by electroconductive interconnects.

5. A method of manufacturing an electronic device comprising a body having a cavity with an inner side and an aperture, and a semiconductor element provided with contacts, which semiconductor element is present in the cavity and at least part of its contacts are situated at the aperture of the cavity;

which method comprises the steps of:

providing the body with the semiconductor element and a cover, which cover comprises a patterned layer of electroconductive material and a sacrificial layer, assembling the body and the cover in such a manner that the contacts of the semiconductor element are connected to the patterned layer of the cover providing an envelope between the cover and the body, the patterned layer being mechanically anchored in the envelope, and removing the sacrificial layer from the cover.

6. A method as claimed in claim 5, wherein the body with the semiconductor element is provided by:

providing the semiconductor element on a temporary carrier, the contacts being at the side of the temporary carrier;

molding the semiconductor element, therewith fanning the body of electrically insulating material; and removal of the temporary carrier, therewith providing the aperture.

7. A method as claimed in claim 6, characterized in that a patterned sub-layer is present in the cover, between the patterned layer and the sacrificial layer, which patterned layer and which sub-layer comprise a first and a second pattern, which patterns are mutually separated by a recess having a larger diameter in the plane of the sub-layer than in the plane of the patterned layer.

8. A method as claimed in claim 6, characterized in that the body comprises a plurality of cavities and is assembled with a suitable cover after placement of semiconductor elements and that after removal of the sacrificial layer, the assembly of body and cover is separated into individual electronic devices.

9. A method as claimed in claim 5, wherein the body is provided with a thermally conductive layer at the inner side of the cavity, which is in thermal communication with the semiconductor element, and wherein the body with the semiconductor element is provided by placing the semiconductor element on the thermally conductive layer of the body.

10. A method as claimed in claim 9, characterized in that the body comprises glass, and the cavity is formed by means of a blasting technique, after which a the fully conductive layer is applied on the inner side of the cavity, which layer extends to beyond the cavity.

11. A method as claimed in claim 9, characterized in that the body is provided by deforming a foil of a thermally conductive layer and a sacrificial layer so as to form the cavity, the sacrificial layer being removed after the envelope has been provided between the body and the cover.

12. A method of manufacturing an electronic device comprising a body having a cavity with an inner side and an aperture, the semiconductor element provided with contacts, which semiconductor element is present in the cavity and at least part of its contacts are situated at the aperture of the cavity; which method comprises the steps of:

providing the body and a cover, at least a part of the inner side of the cavity being provided with a thermally conductive layer, and said cover comprises a patterned layer of electroconductive material and a sacrificial layer, placing the semiconductor element on the patterned layer of the cover;

assembling the body and the cover in such a manner that the semiconductor element is in thermal communication with the thermally conductive layer, and that contacts of the semiconductor elements are connected to the patterned layer of the cover;

providing an envelope between the cover and the body, the patterned layer being mechanically anchored in the envelope, and removing the sacrificial layer from the cover.

* * * * *